United States Patent [19]

Yagi

[11] Patent Number: 4,635,326
[45] Date of Patent: Jan. 13, 1987

[54] SUBSTRATE FASTENER

[75] Inventor: Masaru Yagi, Tsushima, Japan

[73] Assignee: Kitagawa Industries Co., Ltd., Nagoya, Japan

[21] Appl. No.: 755,583

[22] Filed: Jul. 16, 1985

[30] Foreign Application Priority Data

Sep. 12, 1984 [JP] Japan .................. 59-191297

[51] Int. Cl.⁴ .......................... H05K 13/00; F16B 5/06
[52] U.S. Cl. ......................................... 24/453; 24/305; 24/297; 174/138 D; 411/508; 361/412
[58] Field of Search ............... 24/453, 297, 298, 305; 411/508, 509, 510; 361/352, 412, 413; 339/17 LM; 174/138 D; 248/74.3, 73

[56] References Cited

U.S. PATENT DOCUMENTS

| | | | |
|---|---|---|---|
| 3,378,730 | 4/1968 | Poehls | 361/413 |
| 3,599,920 | 8/1971 | Hoegerl | 339/17 LM |
| 3,651,545 | 3/1972 | Hara | 174/138 D |
| 3,688,635 | 9/1972 | Fegen | 174/138 D |
| 3,764,729 | 10/1973 | Kowalewski | 174/138 D |
| 3,777,052 | 12/1973 | Fegen | 174/138 D |
| 3,909,883 | 10/1975 | Fegen | 174/138 D |
| 3,924,918 | 12/1975 | Friend | 361/412 |
| 4,457,482 | 7/1984 | Kitagawa | 248/73 |
| 4,550,362 | 10/1985 | Reimer | 361/413 |

FOREIGN PATENT DOCUMENTS

| | | | |
|---|---|---|---|
| 1061914 | 9/1979 | Canada | 174/138 D |
| 2111579 | 7/1983 | United Kingdom | 24/289 |

Primary Examiner—Victor N. Sakran
Attorney, Agent, or Firm—Oblon, Fisher, Spivak, McClelland, & Maier

[57] ABSTRACT

Described herein is a substrate fastener having a pair of inclined resilient coupling members at the opposite ends of a strut member, the coupling members being resiliently lockable in mounting holes provided in substrates to be fixed. A vertical substrate of a printed wiring board can be fixed in upright position on a horizontal printed wiring board easily and securely by the use of the fastener. Since the substrate fastener occupies only small areas on the substrates, it permits to improve the density of electronic parts which can be practically mounted on the printed wiring boards.

6 Claims, 8 Drawing Figures

SUBSTRATE FASTENER

BACKGROUND OF THE INVENTION

1. Field of the Invention

This invention relates to a substrate fastener to be fitted on substrates of printed circuits or chassis of electronic instruments or appliances for connecting or fixing a plural number of substrates substantially at right angles or at an askew angle to each other.

2. Description of the Prior Art

For example, substrates of printed circuits which are erected in upright positions on a chassis of an electronic instrument are usually connected by directly soldering their circuits or by connector. When mounting printed wiring boards in such upright positions, it has been the conventional practice to fix large substrate retainers opposingly on a horizontal substrate by screws and to hold the side edge portions of the upright substrates in the grooves on the inner side of the substrate retainers. It follows that the stability of the vertical substrates depends upon the width and height of the retainers, as a result, retainers of a large size are required. Use of large retainers, however, limits the number of vertical substrates to be mounted on a horizontal substrate, namely, limits the density of elements or printed wiring boards which can be mounted on a horizontal substrate.

SUMMARY OF THE INVENTION

With the foregoing situation in view, the present invention has as its object the provision of a substrate fastener which can overcome the above-mentioned problems or difficulties and which is arranged in the manner as follows.

Namely, according to the present invention, there is provided a substrate fastener which is provided with a pair of resilient coupling members in inclined state at the opposite ends of a strut member.

Since the substrate fastener of the invention is provided with the resilient coupling members in inclined state, for example, at an angle of 45 degrees relative to the strut member, it can retain horizontal and vertical substrates at right angles or at any arbitrary angle to each other at opposite ends of the strut member which serves as a support rod, simply by fitting the resilient coupling members in mounting holes in the two substrates. Besides, the substrate fastener is used in the form of a small askew strut, so that it occupies only a small space on a substrate, permitting to mount electronic elements thereon in higher packing density.

The above and other objects, features and advantages of the invention will become apparent from the following description and the appended claims, taken in conjunction with the accompanying drawings which show by way of example some preferred embodiments of the invention.

DESCRIPTION OF PREFERRED EMBODIMENTS

Figure 1:
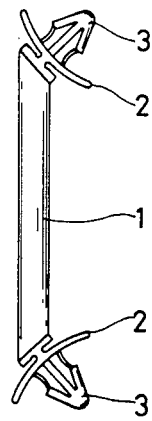
FIG. 1 is a side view of a first embodiment of the invention.

Hereafter, the invention is described more particularly by way of some preferred embodiments shown in the drawings.

Referring to FIG. 1, there is illustrated a first embodiment of the invention in front view, including a rod-like strut member 1 and resilient coupling members 3 which are provided at the opposite ends of the strut member 1 substantially at right angles to the latter and are each provided with resilient support members 2 in a base portion thereof. These resilient coupling members 3 can be fitted in mounting holes in substrates of printed circuits by elastic deformation and locked therein by spreading out its head portion which is protruded on the opposite side of the corresponding substrate. Namely, each resilient coupling member 3 is constituted by a stem portion extending out from the resilient support member 2, arms extending toward the resilient support member 2 from the free end of the stem portion, and thin wall portions connecting the distal ends of the arms to the resilient support member 2. When locked in position, the free ends of the arms engage with the printed circuit board around its mounting hole, while the resilient support member 2 resiliently presses the surface of the board, thereby securely gripping the printed circuit board between the resilient coupling member 3 and resilient support member 2.

Figure 2:
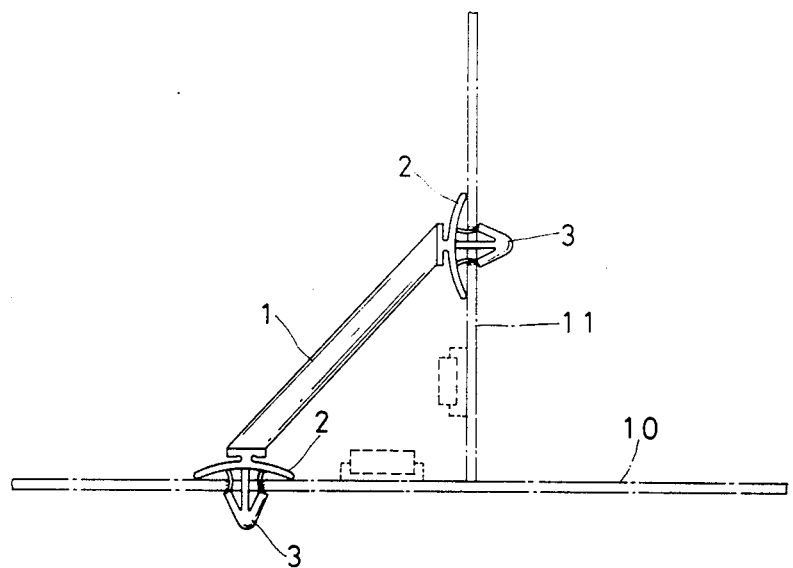
FIG. 2 is a side view of the first embodiment which is used to connect horizontal and vertical substrates at right angles to each other.

The substrate fastener of the above-described construction is formed integrally of a synthetic resin material such as nylon or the like, and, in order to assemble two substrates 10 and 11 at right angles to each other as shown in FIG. 2, the resilient coupling members 3 are simply fitted in mounting holes which are formed in these substrates 10 and 11. Namely, after placing the strut member 1 of the substrate fastener at an angle of 45 degrees in the corner portion between the horizontal and vertical substrates 10 and 11, the laterally facing resilient coupling member 3 is fitted in the mounting hole in the vertical substrate 11 and then the downwardly facing resilient coupling member 3 is fitted in the mounting hole in the horizontal substrate 10. The substrate fastener serves as a diagonal strut, and the vertical substrate 11 can be fixed securely in upright position on the horizontal substrate 10 by attaching at least two similar substrate fasteners to the horizontal substrate 10, acting as support means which is extremely effective for supporting the vertical substrate 11 against vibrations in the lateral directions. In addition, since the substrate fastener occupies only small areas on the substrates, so that it imposes almost no influence on the packing density of electronic parts which are actually mountable on the substrate as shown in dotted line in FIG. 2.

Figure 3:
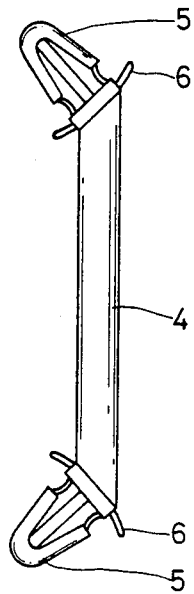
FIG. 3 is a side view of a second embodiment of the invention.
Figure 4:
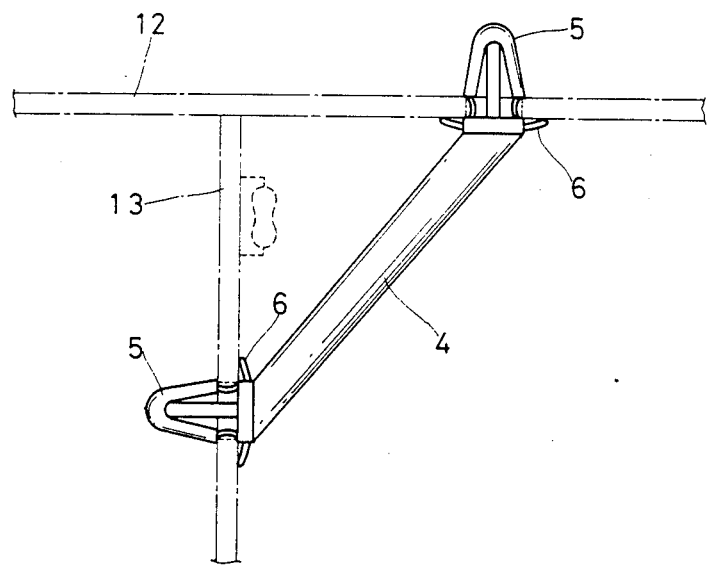
FIG. 4 is a side view of the second embodiment which is used to connect two substrates similarly at right angles to each other.

Illustrated in FIG. 3 is a substrate fastener of the second embodiment, which is provided with a strut member 4 and inclined resilient coupling members 5 at the opposite ends of the strut member 4 at an angle of about 45 degrees with the strut member 4 in the same manner as in FIG. 1. However, resilient support members 6 in FIG. 3 are smaller in size and provided with projections at the opposite ends of a plate-like body. This substrate fastener is used in a manner similar to the foregoing embodiment, for example, to fix a vertical substrate 13 on the lower side of a horizontal substrate 12 substantially at right angles to the latter as shown in FIG. 4.

Figure 5:
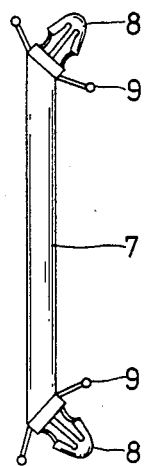
FIG. 5 is a side view of a third embodiment of the invention.
Figure 6:
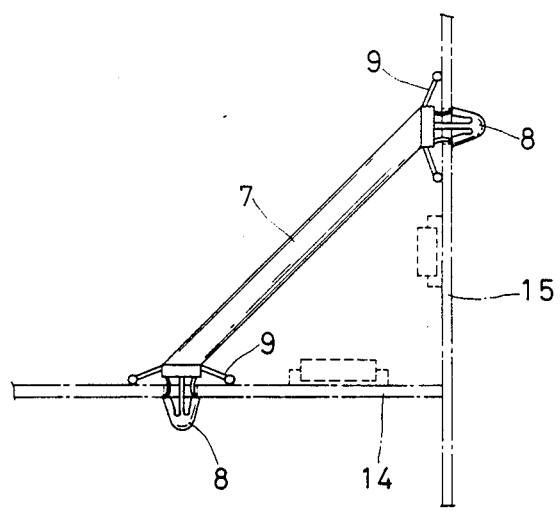
FIG. 6 is a side view of the third embodiment similarly connecting two substrates at right angles to each other.

FIG. 5 illustrates a substrate fastener of the third embodiment, which is likewise provided with a strut member 7 and inclined resilient coupling members 8 at the opposite ends of the strut member 7 substantially at an angle of 45 degrees with the strut member 7. In this case, the resilient support members 9 are in the form of a rod with rounded ends. The substrate fastener of this embodiment is used in the same manner as the foregoing embodiments, for example, to fixedly support a horizontal substrate 14 on a vertical substrate 15 in the fashion of a ledge.

Although the substrate fasteners of the foregoing embodiments are provided with resilient coupling members which are inclined about 45 degrees relative to the strut member, the angle of the coupling members may be varied depending upon the angle at which the two substrates are to be connected to each other.

Figure 7:
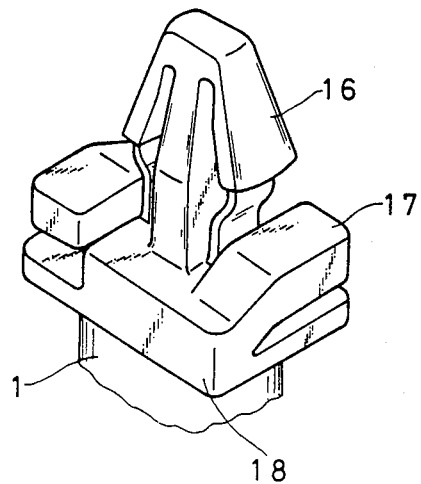
FIG. 7 is a fragmentary perspective view of a fourth embodiment of the invention, showing its resilient coupling end on an enlarged scale.

FIG. 7 shows part of a substrate fastener of the fourth embodiment, which is provided with resilient coupling members 16 of a shape similar to the ones in the foregoing first to third embodiments. However, it is provided with resilient support members of a different shape, each having a pair of resilient support members 17 which are projected in opposite directions substantially in parallel with each other and with a base block 18.

Figure 8:
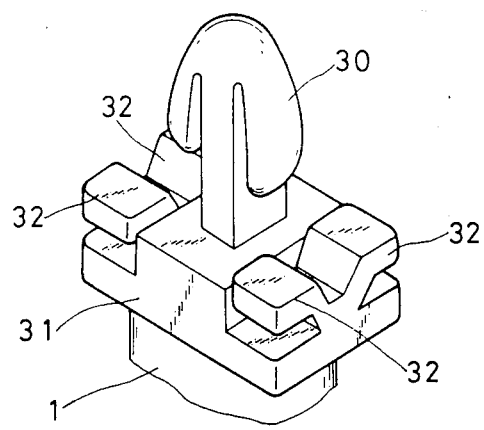
FIG. 8 is a fragmentary perspective view of a fifth embodiment of the invention, showing its resilient coupling end likewise on an enlarged scale.

Illustrated in FIG. 8 is part of a substrate fastener of the fifth embodiment, which is different from the above-described fourth embodiment in that the resilient coupling members 30 are not connected to the base block 31 of the opposing resilient support member at the distal ends of their arms, and a pair of resilient support members 32 are provided at each end of the base block. The paired resilient support strips 32 are extended in opposite directions from a stepped center portion of the base block 31 substantially in parallel with the latter.

The above-described fourth and fifth embodiments are both suitable for applications where the space is limited.

As clear from the foregoing description, it is possible to change the shapes of the resilient coupling members and resilient support members in various ways, and the invention is not restricted to the particular shapes shown.

What is claimed is:

1. A one-piece substrate fastener for a printed circuit board, said fastener being formed of a synthetic resin for connecting substrates at substantially right angles to one another, comprising:
    (a) an elongated strut member having an elongate axis;
    (b) a pair of resilient support members connected to the opposite ends of said strut member by means maintaining said resilient support members in a predetermined inclined state relative to said elongate axis; and
    (c) umbrella-shaped resilient coupling members extending out from said resilient support members obliquely relative to the axis of said elongated strut member, said coupling members each being connected relative to said strut member at angles of 45 degrees, such that said coupling members are mutually angled by approximately 90 degrees;
    whereby said umbrella-shaped resilient coupling members are spread after insertion in mounting holes in substrates to be connected, for stably holding said subtrates at said predetermined angle to each other by said resilient support members and coupling members; and whereby a mounting density of said substrate is increased.

2. The substrate fastener as claimed in claim 1, wherein said resilient support members are each constituted by a plate curved toward the opposing umbrella-shaped coupling member and connected at a center portion thereof to said strut member.

3. The substrate fastener as claimed claim 1, wherein said resilient support members are each in the form of a rod with spherical portions at the opposite ends thereof.

4. The substrate fastener as claimed claim 1, wherein said resilient support members each include a base block having stepped portions at opposite ends thereof, and a pair of resilient support strips rising up from said stepped portion and then extending in opposite directions in parallel relation with said stepped portions.

5. The substrate faster as claimed in claim 1, wherein said resilient support members each include a base block having stepped portions at the opposite ends thereof, and a pair of bifurcated resilient support strips rising up from a center portion of said stepped ends of said base block and then extending in opposite directions in parallel relation with said stepped portion.

6. The substrate fastener as claimed in claim 1, wherein said resilient coupling members are each constituted by a stem portion extending out from said resilient support member, at least a pair of arms extending toward said resilient support member from the free end of said stem portion, and thin wall portions connecting the distal ends of said arms with said resilient support member.

* * * * *